(12) United States Patent
Cheng

(10) Patent No.: US 12,482,700 B2
(45) Date of Patent: Nov. 25, 2025

(54) N-FACE POLAR GaN-BASED DEVICE AND COMPOSITE SUBSTRATE THEREOF, AND METHOD OF MANUFACTURING COMPOSITE SUBSTRATE

(71) Applicant: ENKRIS SEMICONDUCTOR, INC., Jiangsu (CN)

(72) Inventor: Kai Cheng, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 532 days.

(21) Appl. No.: 17/916,635

(22) PCT Filed: Aug. 13, 2020

(86) PCT No.: PCT/CN2020/108976
§ 371 (c)(1),
(2) Date: Oct. 3, 2022

(87) PCT Pub. No.: WO2022/032588
PCT Pub. Date: Feb. 17, 2022

(65) Prior Publication Data
US 2023/0154785 A1 May 18, 2023

(51) Int. Cl.
*H01L 21/762* (2006.01)
*H01L 21/76* (2006.01)
(Continued)

(52) U.S. Cl.
CPC .... *H01L 21/76251* (2013.01); *H01L 21/7605* (2013.01); *H10D 30/015* (2025.01); *H10D 30/475* (2025.01); *H10D 62/8503* (2025.01)

(58) Field of Classification Search
None
See application file for complete search history.

(56) References Cited

U.S. PATENT DOCUMENTS

| 9,299,556 B2 | 3/2016 | Wei et al. |
| 2010/0301347 A1* | 12/2010 | Chung .................. H10D 84/82 438/455 |

(Continued)

FOREIGN PATENT DOCUMENTS

| CN | 102130037 A | 7/2011 |
| CN | 103943459 A | 7/2014 |

(Continued)

OTHER PUBLICATIONS

Chung, J. W. "N-Face GaN/AlGaN HEMTs fabricated Through Layer Transfer Technology" IEEE Elec. Dev. Lett. vol. 30, No. 2 Feb. 2009 pp. 113-116 (Year: 2009).*

(Continued)

*Primary Examiner* — Grant S Withers
(74) *Attorney, Agent, or Firm* — Christopher R. Carroll; The Small Patent Law Group LLC

(57) ABSTRACT

An N-face polar GaN-based device, a composite substrate thereof, and a method of manufacturing the composite substrate are provided in the present disclosure. The N-face polar GaN-based composite substrate includes: a semiconductor substrate, an insulating layer on the semiconductor substrate and a GaN-based material layer on upper surface of the insulating layer; a surface of the GaN-based material layer attached to the insulating layer is Ga-face, and a surface of the GaN-based material layer away from the insulating layer is an N-face. In the present disclosure, the transfer technology is adopted to replace the direct epitaxial growth, which overcomes the difficult growth process, and the N-face polar GaN-based composite substrate with better quality can be obtained.

5 Claims, 2 Drawing Sheets

(51) Int. Cl.
    *H10D 30/01*     (2025.01)
    *H10D 30/47*     (2025.01)
    *H10D 62/85*     (2025.01)

(56) References Cited

U.S. PATENT DOCUMENTS

2013/0273714 A1* 10/2013 Wei ................... H01L 21/76254
                                                                                                     438/458
2018/0138357 A1    5/2018  Henley
2019/0091807 A1    3/2019  Hashimoto et al.

FOREIGN PATENT DOCUMENTS

| | | |
|---|---|---|
| CN | 106449912 A | 2/2017 |
| CN | 106531862 A | 3/2017 |
| CN | 110100306 A | 8/2019 |
| WO | 2009141724 A1 | 11/2009 |

OTHER PUBLICATIONS

ISA State Intellectual Property Office of the People's Republic of China, International Search Report Issued in Application No. PCT/CN2020/108976, May 19, 2021, WIPO, 6 pages.
ISA State Intellectual Property Office of the People's Republic of China, Written Opinion of the International Searching Authority Issued in Application No. PCT/CN2020/108976, May 19, 2021, WIPO, 6 pages. (Submitted with Machine/Partial Translation).

\* cited by examiner

N-FACE POLAR GaN-BASED DEVICE AND COMPOSITE SUBSTRATE THEREOF, AND METHOD OF MANUFACTURING COMPOSITE SUBSTRATE

CROSS-REFERENCE TO RELATED APPLICATIONS

This application is a national phase entry of and claims priority to International Patent Application No. PCT/CN2020/108976 (filed 13 Aug. 2020), the entire disclosure of which is incorporated herein by reference.

TECHNICAL FIELD

This present disclosure relates to the technical field of semiconductor, and more particular, to a N-face polar GaN-based device and a composite substrate thereof, and a method of manufacturing the composite substrate.

BACKGROUND

Wide-bandgap semiconductor materials, such as GaN-based materials, as representative materials of the third-generation semiconductor materials, have the excellent characteristics of large band gap, high voltage resistance, high temperature resistance, high electron saturation velocity and drift velocity, and easy formation of high-quality heterostructures, which are suitable for manufacturing high temperature, high frequency, high power electronic devices.

Generally, the most mature and widely used GaN-based materials are Ga-face polar GaN-based materials, because the Ga-face polar GaN-based materials are easy to prepare and have good crystal quality. However, it is difficult to prepare N-face polar GaN-based materials. However, theoretically, N-face polar GaN-based materials have good ohmic contact, the two-dimensional electron gas in heterojunction has good confinement and high electron mobility, and the polarization direction is opposite to that of Ga-face polar GaN-based materials, which can be applied to various new devices, to promote the development of related industries such as electronics, communications and lighting.

However, it cannot be ignored that there are still some serious problems when epitaxially growing N-face polar GaN-based materials, such as the control of polarity. This is because:

currently, there are two key steps in the direct manufacturing of a N-face polar GaN epitaxial structure by the metalorganic chemical vapor deposition (MOCVD) process, including nitridation in the early stage of growth and annealing in the later stage of production. These two steps are difficult to control effectively, which makes it difficult to grow N-face polar GaN materials, and the quality of N-face polar GaN materials cannot up to the application level.

In addition, the N-face polar GaN epitaxial structure generally uses GaN, SiC or Si substrates. With the continuous improvement of the power density of the device, the heat dissipation problem of GaN high electron mobility transistor (HEMT) devices based on these substrates has become an important issue that restricts the device performance.

To sum up, the existing problems in the related art include: firstly, the process technology for directly manufacturing N-face polar GaN epitaxial structures is immature, and the quality of the manufactured structures is poor, which cannot up to the application level of devices; secondly, the N-face polar GaN epitaxial structures are poor on heat dissipation performance, which brings bad effects on the performance of devices using the N-face polar GaN epitaxial structure.

SUMMARY

The purpose of the present disclosure is to provide an N-face polar GaN-based device, a composite substrate thereof, and a method of manufacturing the composite substrate, so as to improve the crystal quality of the N-face polar GaN-based material in the composite substrate and the performance of the GaN-based device.

In order to achieve the above purpose, first aspect of the present disclosure provides a method of manufacturing an N-face polar GaN-based composite substrate, including:
providing a semiconductor substrate; forming an insulating layer on the semiconductor substrate;
providing a GaN-based material layer grown on a carrier board, where a surface of the GaN-based material layer far away from the carrier board is a Ga-face;
performing wafer-bonding for the insulating layer with the Ga-face of the GaN-based material layer;
after the wafer-bonding process, peeling off the carrier board, such that an exposed surface of the GaN-based material layer is the N-face.

In some embodiments, the insulating layer is formed on each of surfaces of the semiconductor substrate.

In some embodiments, the insulating layer includes nitrogen element.

In some embodiments, the insulating layer is a single-layer structure, and a material of the single-layer structure includes one of or a mixture of two or more of silicon nitride, aluminum nitride or silicon oxynitride; or the insulating layer is a multi-layer structure, and the multi-layer structure includes a silicon dioxide layer and an aluminum nitride layer from bottom to top, or a silicon nitride layer and an aluminum nitride layer from bottom to top.

In some embodiments, a material of the GaN-based material layer includes at least one of GaN, AlGaN, InGaN or AlInGaN.

In some embodiments, a material of the semiconductor substrate includes sapphire, silicon carbide, silicon, GaN, AlN or diamond.

In some embodiments, a thickness of the semiconductor substrate is 1 nm to 100 nm.

Second aspect of the present disclosure provides an N-face polar GaN-based composite substrate, including:
a semiconductor substrate;
an insulating layer on the semiconductor substrate; and
a GaN-based material layer on the insulating layer, a surface of the GaN-based material layer attached to the insulating layer is a Ga-face, and a surface far away from the insulating layer is an N-face.

In some embodiments, each of surfaces of the semiconductor substrate is covered with the insulating layer.

In some embodiments, the insulating layer includes nitrogen element.

In some embodiments, the insulating layer is a single-layer structure, and a material of the single-layer structure includes one of or a mixture of two or more of silicon nitride, aluminum nitride or silicon oxynitride; or the insulating layer is a multi-layer structure, and the multi-layer structure includes a silicon dioxide layer and an aluminum nitride layer from bottom to top, or a silicon nitride layer and an aluminum nitride layer from bottom to top.

In some embodiments, a material of the GaN-based material layer includes at least one of GaN, AlGaN, InGaN or AlInGaN.

In some embodiments, a material of the semiconductor substrate includes sapphire, silicon carbide, silicon, GaN, AlN or diamond.

Third aspect of the present disclosure provides an N-face polar GaN-based device, including the N-face polar GaN-based composite substrate described in any one of the above, and a heterojunction structure, a source electrode, a drain electrode and a gate electrode on the N-face polar GaN-based composite substrate.

Figure 1:
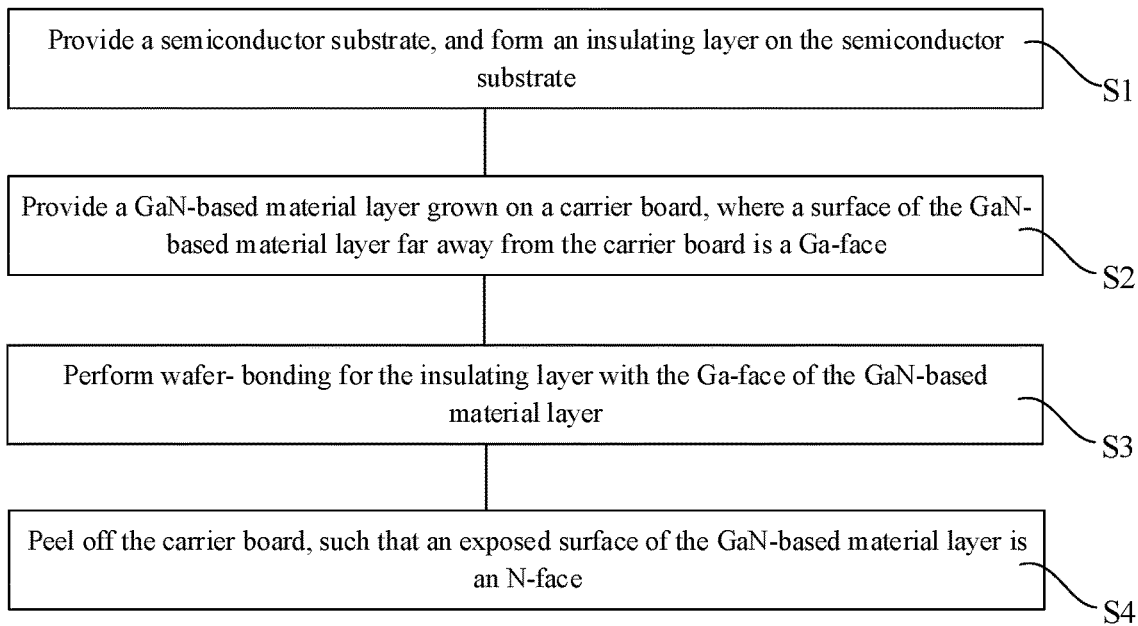
FIG. 1 is a flowchart of a method of manufacturing N-face polar GaN-based composite substrate according to the first embodiment of the present disclosure.

To facilitate the understanding of the present disclosure, all reference signs present in the present disclosure are listed below:

| | |
|---|---|
| semiconductor substrate 10 | insulating layer 11 |
| GaN-based material layer 12 | carrier board 20 |
| first insulating layer 111 | second insulating layer 112 |
| N-face polar GaN-based composite substrate 1, 2, 3 | |

DETAILED DESCRIPTION OF THE EMBODIMENTS

In order to make the above-mentioned objects, features and advantages of the present disclosure more obvious and understandable, embodiments of the present disclosure will be described in detail below with reference to the accompanying drawings.

Figure 2:
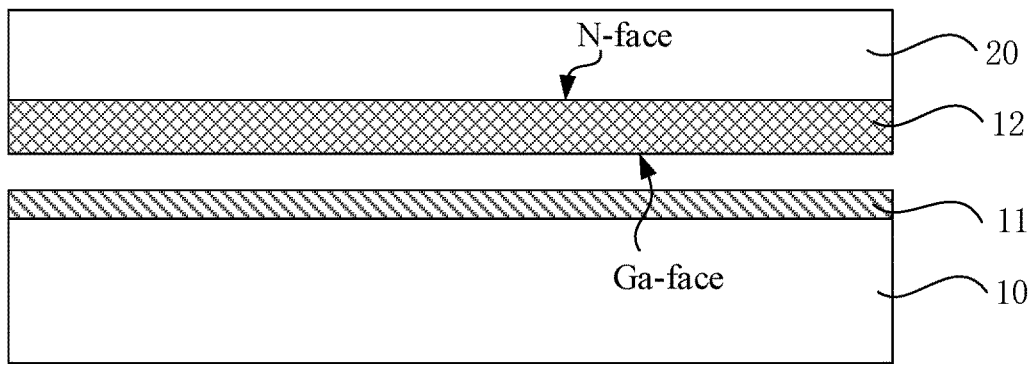
FIGS. 2 and 3 are schematic views illustrating intermediate structures corresponding to the process in FIG. 1.
Figure 3:
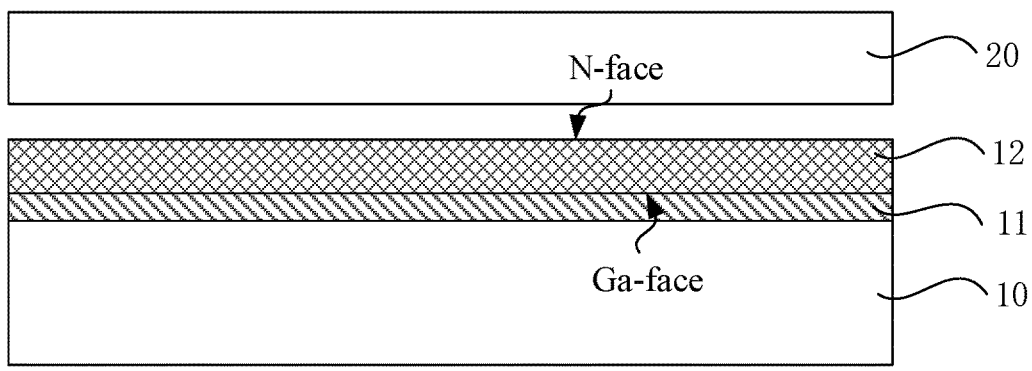
Figure 4:
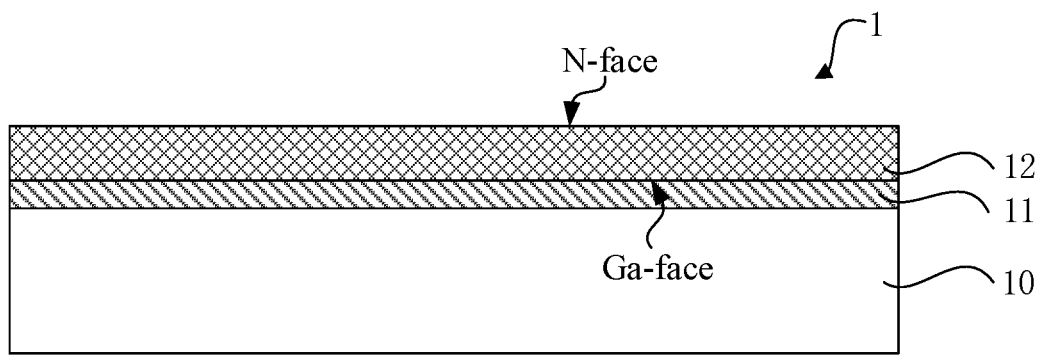
FIG. 4 is a cross-sectional structural diagram of an N-face polar GaN-based composite substrate according to the first embodiment of the present disclosure.

FIG. 1 is a flowchart of a method of manufacturing an N-face polar GaN-based composite substrate according to the first embodiment of the present disclosure; and FIGS. 2 and 3 are schematic views illustrating intermediate structures corresponding to the process in FIG. 1. FIG. 4 is a cross-sectional structural diagram of an N-face polar GaN-based composite substrate according to the first embodiment of the present disclosure.

First, referring to step S1 in FIG. 1 and FIG. 2, a semiconductor substrate 10 is provided, and an insulating layer 11 is formed on the semiconductor substrate 10.

The material of the semiconductor substrate 10 may include a material with better thermal conductivity, such as sapphire, silicon carbide, silicon, GaN, AlN, or diamond.

The insulating layer 11 may include nitrogen element. In some examples, the insulating layer is a single-layer structure, and a material of the single-layer structure includes one of or a mixture of two or more of silicon nitride, aluminum nitride or silicon oxynitride; or the insulating layer is a multi-layer structure, and the multi-layer structure may include a silicon dioxide layer and an aluminum nitride layer from bottom to top, or a silicon nitride layer and an aluminum nitride layer from bottom to top. In other words, the insulating layer 11 may be a composite layer.

The insulating layer 11 may be formed by a physical vapor deposition method or a chemical vapor deposition method. In this embodiment, the insulating layer 11 is formed on the upper surface of the semiconductor substrate 10. The semiconductor substrate 10 has good thermal conductivity, which can avoid local overheating for the semiconductor substrate 10 during the deposition process of the insulating layer 11 to affect thickness uniformity of the insulating layer 11.

The thickness of the insulating layer 11 can be 1 nm to 100 nm.

Next, referring to step S2 in FIG. 1 and FIG. 2, the GaN-based material layer 12 grown on the carrier board 20 is provided, and a surface of the GaN-based material layer 12 far away from the carrier board 20 is the Ga-face.

The material of the GaN-based material layer 12 may include at least one of GaN, AlGaN, InGaN, or AlInGaN.

It should be noted that, in this embodiment, a certain material is represented by chemical elements, but the molar ratio of each chemical element in the material is not limited. For example, GaN material contains Ga element and N element, but the molar ratio of Ga element and N element is not limited; AlGaN material contains three elements, Al, Ga, and N, but the molar ratio of each of the three elements is not limited.

The epitaxial growth process for the GaN-based material layer 12 on the carrier board 20 may include: Atomic Layer Deposition (ALD), Chemical Vapor Deposition (CVD), molecular beam epitaxial (MBE), Plasma Enhanced Chemical Vapor Deposition (PECVD), Low Pressure Chemical Vapor Deposition (LPCVD), Metal-Organic Chemical Vapor Deposition (MOCVD), or a combination thereof.

In the GaN-based material layer 12 grown on the carrier board 20, a Ga-N bond parallel to the C-axis ([0001] crystal orientation) is used as a reference, the Ga atom in each Ga-N bond is further away from the carrier board 20, namely, the surface close to the carrier board 20 is the N-face, and the surface far from the carrier board 20 is the Ga-face.

Step S1 and step S2 have no sequence, and may also be performed simultaneously.

Then, referring to step S3 in FIG. 1 and FIG. 2, the insulating layer 11 and the Ga-face of the GaN-based material layer 12 are wafer-bonded.

The mechanism of wafer bonding is that the wafers are fused by a high temperature diffusion process under a certain mechanical pressure.

Before the wafer bonding, the method may further include: performing surface treatment on the wafer of the GaN-based material layer 12 carried on the carrier board 20. Wafer surface treatment mainly includes a series of steps such as polishing, cleaning, removal of oxides and organic contaminants on the wafer surface, and activation of the wafer surface. The reason to perform surface treatment on the wafer is the surface properties of the wafer have some influences on the bonding effect. The influences specifically include:

The stress of the atoms in the surface layer is different from that in the crystal block, which causes the change of the surface lattice constant and makes the arrangement of atoms at the surface and in the interior are significantly different, such as relaxation, reconstruction, and stepwise.

The flatness and smoothness of the wafer determine the entire contact amount between the wafer and the material layer to be bonded. The expansion of the bonding contact area depends on the flexibility of the material, the magnitude of the mutual force and the magnitude of the external pressure. The surface of the wafer is flat, and the contact area between the wafer and the material layer to be bonded is increased, so that the bonding is strong.

It follows that a sufficiently clean, flat, and smooth wafer surface is a prerequisite for successful bonding, so that the wafer can be polished to ensure sufficient Van der Waals force to bond.

The method for cleaning the surface of the wafer may include: the wafer was ultrasonically cleaned in acetone and methanol/isopropanol solution to remove dust, organic matter and some metal impurities on the surface of the wafer; next, the wafer was rinsed with deionized water; and then the wafer was immersed in diluted HF acid solution to remove the intrinsic oxide layer on its surface; finally, the wafer was rinsed with deionized water, and the rinsed wafer was blown dry with nitrogen (or the wafer was spun dry by a spinner).

The advantages of wafer bonding technology are: (1) The dislocation defects generated by lattice mismatch are only limited to the bonding interface area, and will not migrate to the active region of the device to affect the performance of the device. The problem that lattice mismatch between different materials is well resolved and the dislocation density is greatly reduced. (2) The atomic-level bonding in the bonding interface not only makes the device have good electrical and optical properties, but also provides sufficient bonding strength, so that the bonding material can be mechanically processed like a single crystal material, such as cleavage, cutting, grinding and polishing. (3) A new idea is presented for designing, the design of device (especially integrated device) is freer. (4) The process is simplified, and the difficulty of optoelectronic integration is reduced.

During the wafer bonding process, the nitrogen atoms in the insulating layer 11 can combine with the gallium atoms on the Ga-face of the GaN-based material layer 12 to form Ga-N bonds, so the bonding is firm.

The semiconductor substrate 10 has better thermal conductivity, and can avoid local overheating for the semiconductor substrate 10 during the bonding process of the GaN-based material layer 12, thereby avoiding warping.

Next, referring to step S4 in FIG. 1 and FIGS. 3 and 4, after the wafer bonding process, the carrier board 20 is peeled off, such that the exposed surface of the GaN-based material layer 12 is the N-face.

Referring to FIG. 2, before the GaN-based material layer 12 is bonded, the N-face of the GaN-based material layer 12 is first carried on the carrier board 20. The Ga-face of the GaN-based material layer 12 is made to face to the insulating layer 11. As shown in FIG. 3, after the bonding process, the carrier board 20 is peeled off, and the N-face of the GaN-based material layer 12 is exposed.

Referring to FIG. 4, the N-face polar GaN-based composite substrate 1 provided in the first embodiment includes:
  semiconductor substrate 10;
  an insulating layer 11 on the semiconductor substrate 10; and
  a GaN-based material layer 12 on the insulating layer 11, a surface of the GaN-based material layer 12 attached to the insulating layer 11 is a Ga-face, and a surface far away from the insulating layer 11 is an N-face.

The insulating layer 11 may include nitrogen element. In some examples, the insulating layer is a single-layer structure, and a material of the single-layer structure includes one of or a mixture of two or more of silicon nitride, aluminum nitride or silicon oxynitride; or the insulating layer is a multi-layer structure, and the multi-layer structure includes a silicon dioxide layer and an aluminum nitride layer from bottom to top, or a silicon nitride layer and an aluminum nitride layer from bottom to top.

The thickness of the insulating layer 11 can be 1 nm to 100 nm.

The material of the semiconductor substrate 10 may include a material with better thermal conductivity, such as sapphire, silicon carbide, silicon, AlN, or diamond. The material of the insulating layer 11 can be silicon nitride, aluminum nitride or silicon oxynitride. The material of the GaN-based material layer 12 may include at least one of GaN, AlGaN, InGaN, or AlInGaN.

In the embodiment, the transfer technology is adopted to replace the direct epitaxial growth, which overcomes the difficult growth process, and the N-face polar GaN-based composite substrate 1 with better quality can be obtained. In addition, the insulating layer 11 includes nitrogen element, and the nitrogen atoms can combine with the gallium atoms of the Ga-face in the GaN-based material layer 12 to form Ga-N bonds, and the bonding is firm. Therefore, a N-face polar GaN-based composite substrate 1 with a better quality can be obtained.

When the material of the semiconductor substrate is diamond, as the substrate of the device, the diamond can make the transferred N-face polar GaN-based composite substrate 1 have good thermal conductivity, which lays a foundation for the follow-up realization of microwave high-power devices.

Figure 5:
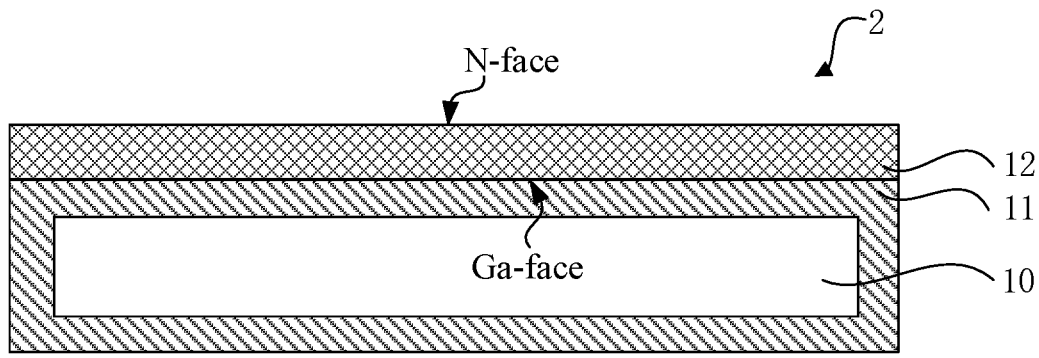
FIG. 5 is a cross-sectional structural diagram of an N-face polar GaN-based composite substrate according to the second embodiment of the present disclosure.

FIG. 5 is a cross-sectional structural diagram of an N-face polar GaN-based composite substrate according to the second embodiment of the present disclosure.

Referring to FIG. 5, the N-face polar GaN-based composite substrate 2 according to the second embodiment is substantially the same as the N-face polar GaN-based composite substrate 1 according to the first embodiment, except that all surfaces of the semiconductor substrate 10 are coated with an insulating layer 11.

The insulating layer 11 may include nitrogen element. In some examples, the insulating layer is a single-layer structure, and a material of the single-layer structure includes one of or a mixture of two or more of silicon nitride, aluminum nitride or silicon oxynitride; or the insulating layer is a multi-layer structure, and the multi-layer structure includes a silicon dioxide layer and an aluminum nitride layer from bottom to top, or a silicon nitride layer and an aluminum nitride layer from bottom to top.

Correspondingly, the manufacturing method of N-face polar GaN-based composite substrate 2 according to the second embodiment is substantially the same as the manufacturing method of N-face polar GaN-based composite substrate 1 according to the first embodiment, except that in step S1, an insulating layer 11 is formed on all surfaces of the semiconductor substrate 10.

The insulating layer 11 may be formed by a physical vapor deposition method or a chemical vapor deposition method.

In some embodiments, in step S1, the strength of vacuum pumping to the reaction chamber is reduced to deposit the reactant on the side surface of the semiconductor substrate 10 when the insulating layer 11 on the semiconductor substrate 10 is deposited by physical vapor deposition or chemical vapor deposition; after that, the semiconductor substrate 10 is turned over, and the insulating layer 11 is again deposited by physical vapor deposition or chemical vapor deposition on the lower surface of the semiconductor substrate 10.

In some embodiments, step S1 may also be realized by suspending the semiconductor substrate 10 in a physical vapor deposition chamber or a chemical vapor deposition chamber.

The insulating layer 11 on each side and bottom of the semiconductor substrate 10, on the one hand, can make the surface tension of the insulating layer 11 uniform and make the surface flat, which is beneficial to wafer bonding; on the other hand, can prevent the semiconductor substrate 10 coated with the insulating layer 11 from bumping during the transfer process to cause uneven thickness of the surface-to-be-bonded of the insulating layer.

Figure 6:
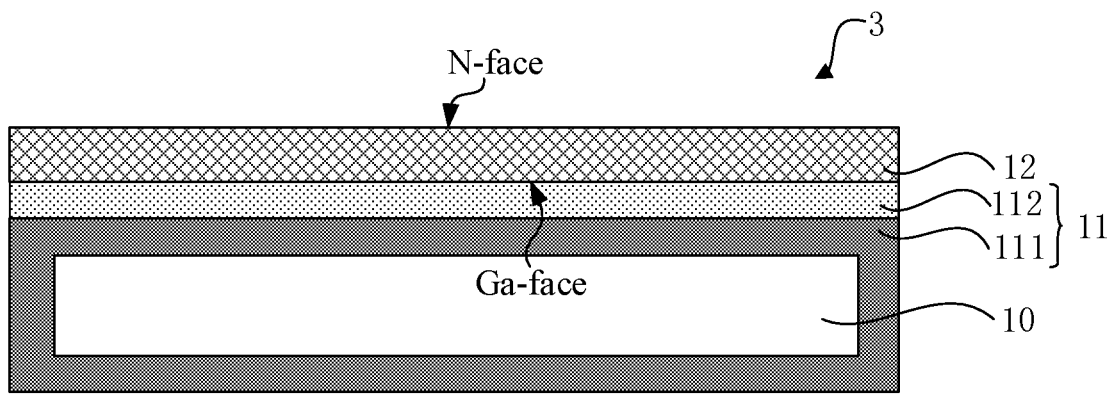
FIG. 6 is a cross-sectional structural diagram of an N-face polar GaN-based composite substrate according to the third embodiment of the present disclosure.

FIG. 6 is a cross-sectional structural diagram of an N-face polar GaN-based composite substrate according to the third embodiment of the present disclosure.

Referring to FIG. 6, the N-face polar GaN-based composite substrate 3 according to the third embodiment is substantially the same as the N-face polar GaN-based composite substrate 2 according to the second embodiment. The insulating layer 11 has a multi-layer structure and includes a first insulating layer 111 and a second insulating layer 112 from the bottom to the top; the material of the first insulating layer 111 may include silicon dioxide or silicon nitride, and the second insulating layer 112 may be aluminum nitride. In the embodiment, the insulating layer 11 is a silicon dioxide/aluminum nitride composite layer or a silicon nitride/aluminum nitride composite layer. The difference only is that in the third embodiment, the areas of the first insulating layer 111 and the second insulating layer 112 are different. The first insulating layer 111 covers all surfaces of the semiconductor substrate 10, while the second insulating layer 112 is formed only on the upper surface of the first insulating layer 111, and the second insulating layer 112 is in contact with the Ga-face of the GaN based material layer 12.

Correspondingly, the manufacturing method of N-face polar GaN-based composite substrate 3 according to the third embodiment is substantially the same as the manufacturing method of N-face polar GaN-based composite substrate 2 according to the second embodiment, except that in step S1, a first insulating layer 111 is formed on all surfaces of the semiconductor substrate 10, and a second insulating layer 112 is formed on the upper surface of the first insulating layer 111.

An embodiment of the present disclosure also provides an N-face polar GaN-based device, including any one of the above-mentioned N-face polar GaN-based composite substrates 1, 2, or 3, and a heterojunction structure, a source electrode, a drain electrode, and a gate electrode on the N-face polar GaN-based composite substrates 1, 2, or 3.

The material of the heterojunction structure may be a group III nitride material. In some embodiments, the heterojunction structure may include a channel layer and a barrier layer from bottom to top. A two-dimensional electron gas or a two-dimensional hole gas may be formed at the interface between the channel layer and the barrier layer. In an example, the channel layer is an intrinsic GaN layer and the barrier layer is an N-type AlGaN layer. In other examples, the material combination for the channel layer and the barrier layer can also be GaN/InAlGaN, GaN/AlN, GaN/InN, or GaN/InAlN. In addition, the channel layer and the barrier layer may have one layer respectively, or may have multiple layers respectively, and the multiple layers are alternately distributed; or may have one channel layer and two or more barrier layers to form a multi-barrier structure.

In some embodiments, the materials for the source electrode, the drain electrode and the gate electrode can be metals, such as Ti/Al/Ni/Au, Ni/Au, etc.

A p-type semiconductor layer may be provided between the gate electrode and the heterojunction structure, that is, the N-face polar GaN-based device is a HEMT device. The p-type semiconductor layer is used to form a normally off state, that is, to form an enhanced HEMT device.

A gate insulating layer may also be provided between the gate electrode and the heterojunction structure, that is, the N-face polar GaN-based device is a metal-oxide-semiconductor (MOS) device. The material of the gate insulating layer may include at least one of SiN, $Al_2O_3$, $HfO_2$, MgO, $TiO_2$, or $Ga_2O_3$.

Although the present disclosure discloses the above contents, the present disclosure is not limited thereto. Any person skilled in the art can make various variants and modifications to the present disclosure without departing from the spirit and scope of the present disclosure. Therefore, the protection scope of the present disclosure should be set forth by the appended claims.

The invention claimed is:

1. A method of manufacturing an N-face polar GaN-based composite substrate, comprising:
   providing a semiconductor substrate;
   forming an insulating layer on the semiconductor substrate;
   providing a GaN-based material layer grown on a carrier board, wherein a surface of the GaN-based material layer far away from the carrier board is a Ga-face;
   performing wafer-bonding for the insulating layer with the Ga-face of the GaN-based material layer; and
   after wafer-bonding, peeling off the carrier board, such that an exposed surface of the GaN-based material layer is the N-face;
   wherein the insulating layer comprises a nitrogen element, the insulating layer is a multi-layer structure, and the multi-layer structure comprises a silicon dioxide layer and an aluminum nitride layer from bottom to top, or a silicon nitride layer and an aluminum nitride layer from bottom to top.

2. The method according to claim 1, wherein the insulating layer is formed on each of surfaces of the semiconductor substrate.

3. The method according to claim 1, wherein a material of the GaN-based material layer comprises at least one of GaN, AlGaN, InGaN or AlInGaN.

4. The method according to claim 1, wherein a material of the semiconductor substrate comprises sapphire, silicon carbide, silicon, GaN, AlN or diamond.

5. The method according to claim 1, wherein a thickness of the insulating layer is 1 nm to 100 nm.

* * * * *